United States Patent
Tsuchiya

(10) Patent No.: US 6,853,015 B2
(45) Date of Patent: Feb. 8, 2005

(54) OPTICAL SEMICONDUCTOR DEVICE INCLUDING INGAALAS DOPED WITH ZN

(75) Inventor: Tomonobu Tsuchiya, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 138 days.

(21) Appl. No.: 10/173,753

(22) Filed: Jun. 19, 2002

(65) Prior Publication Data

US 2003/0042479 A1 Mar. 6, 2003

(30) Foreign Application Priority Data

Sep. 5, 2001 (JP) ........................ 2001-268421

(51) Int. Cl.[7] ............... H01L 31/0328; H01L 31/0336; H01L 31/072; H01L 31/109; H01L 35/26
(52) U.S. Cl. ........................ 257/185; 372/45
(58) Field of Search ............... 257/14, 185; 372/45, 372/43

(56) References Cited

U.S. PATENT DOCUMENTS

| 5,132,981 | A | * | 7/1992 | Uomi et al. | 372/45 |
| 5,253,264 | A | * | 10/1993 | Suzuki et al. | 372/46 |
| 2001/0006529 | A1 | * | 7/2001 | Komori et al. | 372/96 |
| 2002/0071462 | A1 | * | 6/2002 | Takemoto et al. | 372/43 |

FOREIGN PATENT DOCUMENTS

JP  7-131105  5/1995

OTHER PUBLICATIONS

"Ultrahigh relaxation oscillation frequency (up to 30 GHz) of highly p–doped GaAs/GaAlAs multiple quantum well lasers" Uomi et al., *American Institute of Physics* 1987 pp. 78–80.

"Doping characteristics of undoped and Zn–doped In(Ga) AIAs layers grown by low–pressure metalorganic vapour phase epitaxy" Reier et al., *Journal of Crystal Growth 135* (1994) pp. 463–468.

"Improved Behavior of Monolithically Integrated Laser/Modulator by Modified Identical Active Layer Structure," P. Steinmann et al., IEEE 1997, p. 1561.

"Temperature Performance of 1.3–μm InGaAsP–InP Lasers with Different Profile of p–Doping" G.L. Belenky et al., IEEE 1997, pp. 1558–1560.

* cited by examiner

Primary Examiner—W. David Coleman
(74) Attorney, Agent, or Firm—Antonelli, Terry, Stout & Kraus, LLP

(57) ABSTRACT

A modulation doped multiple quantum well structure having a steep Zn profile of several nm by the balance between an increase in a Zn concentration and a decrease in Zn diffusion by using metal organic vapor phase epitaxy using Zn, in which an InGaAlAs quaternary alloy is used and the Zn concentration and the range for crystal composition are defined to equal to or less than the critical concentration at which Zn diffuses abruptly in each of InGaAlAs compositions.

22 Claims, 10 Drawing Sheets

OPTICAL SEMICONDUCTOR DEVICE INCLUDING INGAALAS DOPED WITH ZN

BACKGROUND OF THE INVENTION

1. Field of the Invention

This invention relates to a semiconductor laser device using an optical semiconductor device, particularly, InGaAlAs.

2. Related Art

In a crystal growing method of a semiconductor laser on an InP substrate, a metal organic vapor phase epitaxy is mainly used in which the crystal composition is mainly formed of InGaAsP, and Zn is used for a p-type dopant and Si, Se is used for an n-type dopant. Si or Se as the n-type dopant less diffuses, while Zn as the p-type dopant diffuses easily. Accordingly, in a case of fabricating, for example, a structure in which Zn is doped only to a barrier layer in a multiple quantum well structure of thin film (modulation doped multiple quantum well structure), since Zn diffuses from the barrier layer to the well layer, it was difficult to attain a steep doping profile. Further, as an example other than the thin film, in a case where the concentration of Zn in a p-type guiding layer or a p-type buried layer is increased, although the laser characteristic is improved to a certain level of the Zn concentration, the laser characteristic is deteriorated abruptly since Zn diffuses as far as the undoped active layer when the Zn concentration is excessively high. The following examples are reported for the relation between the doping characteristic and the laser characteristic in the modulation doped multiple quantum well structure or the p-type guiding layer.

(1) For the Zn modulation doped multiple quantum well structure of an InGaAsP laser, there is an example of disposing InGaAs of 0.7 nm thickness in the barrier layer as a Zn diffusion suppression layer. This example is disclosed, for example, in Japanese Patent Laid-open No. 131105/1995 (Document 1).

(2) For the p-type modulation doped structure other than Zn, there is an example of the study of Be. This example is disclosed, for example, in Applied Physics Letters, p 78, vol. 51 (1987) (Document 2).

(3) On the other hand, an InGaAlAs has been noted as the crystal materials other than InGaAsP and Zn doping for the InGaAlAs system is reported. This is studied, for example, in Journal of Crystal Growth, p 463, vol. 135 (1994) (Document 3).

(4) Relation between the Zn concentration of a p-type guiding layer or a p-cladding layer and the device characteristic is also reported in the InGaAsP laser. This is disclosed, for example, in IEEE Photonics Technology Letters, p 1558, vol. 9, No. 12 (1997) (Document 4).

SUMMARY OF THE INVENTION

An object of the present invention is to provide an optical semiconductor device having an active layer region of a favorable quantum well structure and improve the relaxation oscillation frequency characteristic of the optical semiconductor device.

Another object of the present invention is to provide an optical semiconductor device having an active layer region of a multiple quantum structure applied with favorable p-type modulation doped and improve the relaxation oscillation frequency characteristic of the optical semiconductor device.

A more specific technical object of this invention is to provide an active layer region of a multiple quantum well structure applied with p-type modulation doping under the background involved with a difficulty in controlling steep doping concentration with Zn in the field of the compound semiconductors. For this purpose, it is necessary to attain a steep doping profile with the typical p-type dopant Zn. Further, in the laser device structure, it is possible to decrease the device resistance while suppressing increase of the threshold current or degradation of the efficiency in the laser device structure.

The gist of a first aspect of the present invention is as follows:

(1) An InGaAlAs quaternary alloy is used as a semiconductor material for an active layer region.

(2) The active layer region is formed of a quantum well structure and the quantum well structure is applied with modulation doping by using the p-type dopant Zn for the barrier layer. Further, depending on the requirement, a multiple quantum well structure can be used for the quantum well structure. Further, it will be apparent that a strained quantum well structure, a strain-compensated quantum well structure or the like may also be used as required.

This invention has been accomplished based on the finding that modulation doping of the p-type dopant usable for the active layer region of the semiconductor laser device can be performed while sufficiently insuring the concentration of the p-type dopant in the InGaAlAs quaternary alloy.

More specifically, according to the invention, it is possible, in the metal organic vapor phase epitaxy using Zn, to balance an increase in a Zn concentration and the diffusion of Zn and attain a steep Zn doping profile at a film thickness, for example, of several tens nm or less.

DETAILED DESCRIPTION OF THE PREFERRED EMBODIMENTS

Prior to the exemplification of specific embodiments, the basic matters of the typical embodiments of the invention will be detailed.

It is apparently important in this invention to increase the Zn concentration so as not to exceed a critical concentration at which Zn diffusion occurs abruptly with respect to the material used. Specifically, as a compound semiconductor material used for a barrier layer of a multiple quantum well structure, a quaternary alloy of InGaAlAs material is used instead of the InGaAsP material used so far and the Zn concentration is defined to less than the critical concentration at which Zn diffusion increases abruptly in each of the InGaAlAs compositions. The InGaAlAs can control the band gap wavelength within a range equivalent with the InGaAsP under lattice matching with the InP substrate. That is, the range of the composition from InP to InGaAs can be controlled. Further, it is judged that a saturation concentration of Zn in the InGaAlAs is higher compared with that of the InGaAsP in an identical band gap wavelength. For example, a saturation concentration of InP (band gap wavelength: 927 nm) is $1 \times 10^{18}$ $cm^{-3}$–$2 \times 10^{18}$ $cm^{-3}$ and a saturation concentration of InAlAs (band gap wavelength: 850 nm) is $2 \times 10^{18}$ $cm^{-3}$–$3 \times 10^{18}$ $cm^{-3}$. Details will be understood with reference to FIG. 1. Zn diffusion depends on the saturation of Zn concentration in each epitaxial layer. At an identical Zn concentration, the critical concentration at which Zn diffuses is higher in the epitaxial layer of higher saturation concentration. Therefore, Zn less diffuses in the InGaAlAs layer than in the InGaAsP layer at an identical band gap wavelength. In this invention, the critical concentration at which Zn diffuses to each of InGaAlAs compositions is studied, intending to increase the Zn concentration below the level of the above-mentioned critical concentration.

Figure 1:
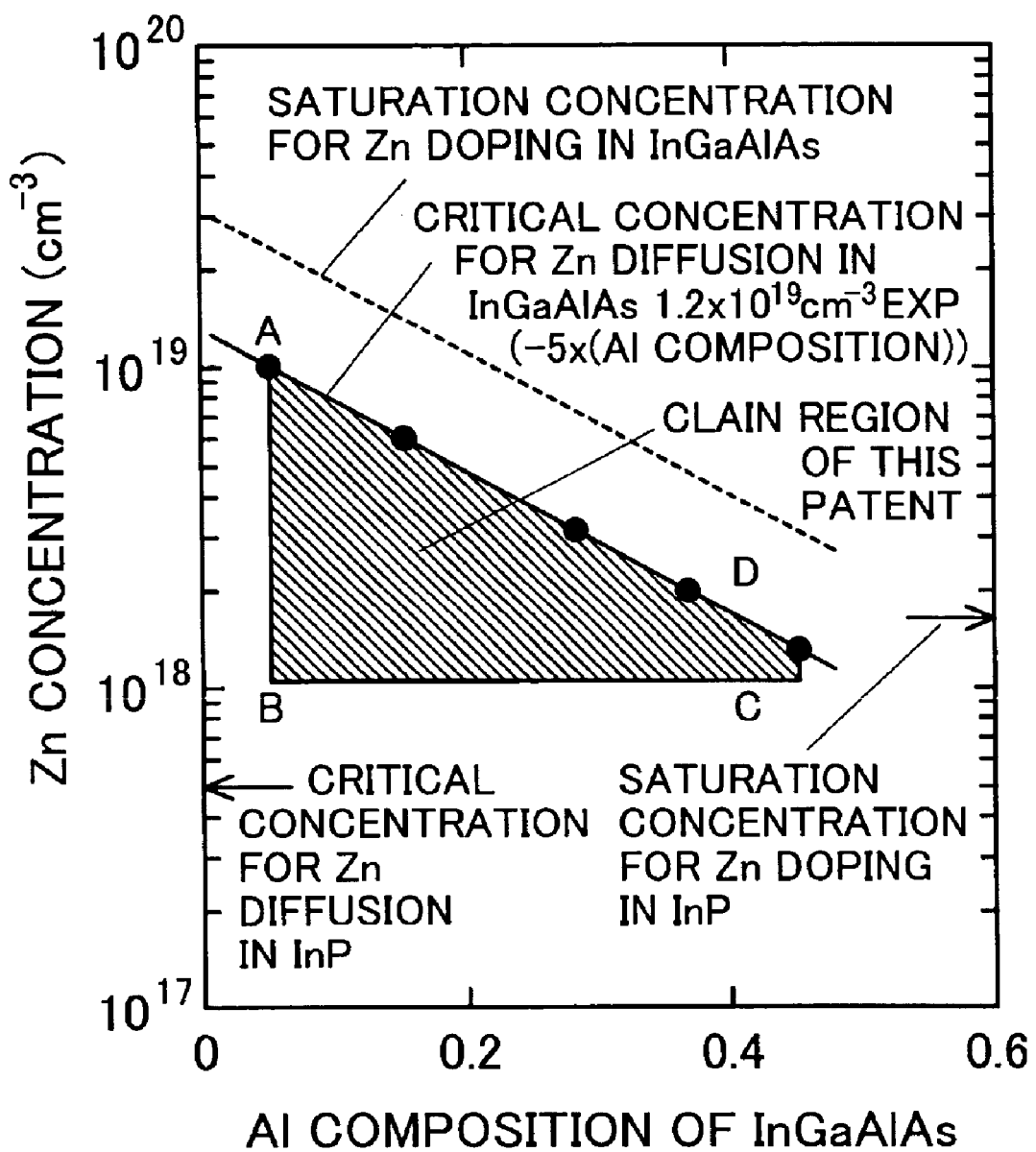
FIG. 1 is a diagram showing a relation of a compositional ratio of Al and a concentration of Zn in InGaAlAs system materials.
Figure 2:
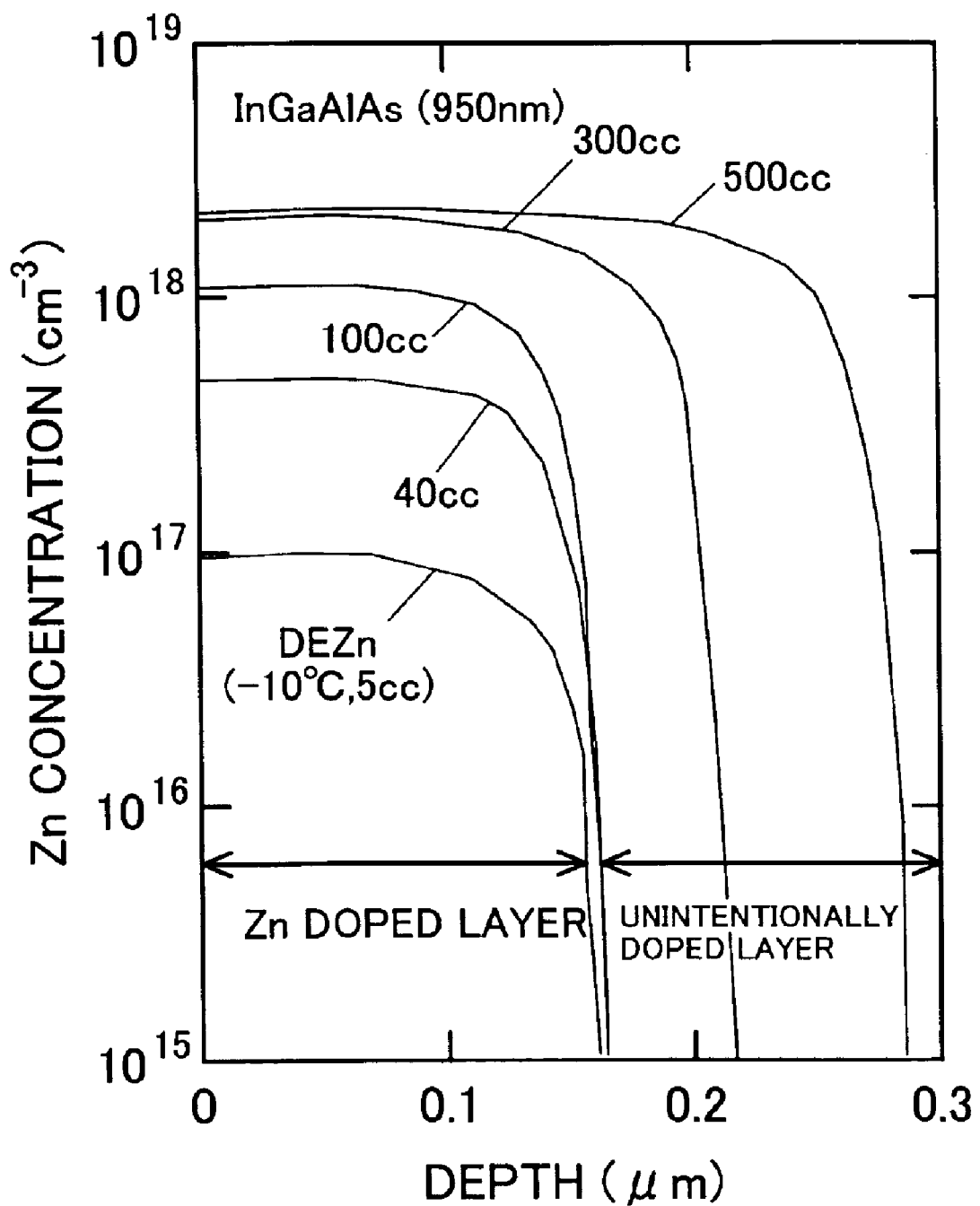
FIG. 2 is a graph showing an example of Zn profiles in both undoped and Zn-doped InGaAlAs layers.

Embodiments of this invention are to be described in detail with reference to FIGS. 1 to 5. FIG. 1 is a diagram showing a relation of a compositional Al ratio and a concentration of Zn in InGaAlAs system materials, and FIG. 2 shows Zn profiles when undoped InGaAlAs layers and Zn-doped InGaAlAs layer are grown on InP substrates. In this case, the undoped InGaAlAs layer is lattice matched with the InP substrate, and the band gap wavelength is 950 nm. Further, the Zn-doped InGaAlAs layer is lattice matched with the InP substrate and the band gap wavelength is 950 nm. Each of the curves shows the result in a case of a carrier gas flow rate of DEZn (Diethyl zinc) as the Zn starting material, at 5 cc/sec, 40 cc/sec, 100 cc/sec, 300 cc/sec and 500 cc/sec. The temperature of the thermostable bath for DEZn is −10° C. in this example.

According to FIG. 2, the following facts can be recognized. The concentration of Zn increases along with the supplied amount of DEZn as the Zn starting material but Zn diffusion to the undoped layer increases about above $2 \times 10^{18}$ $cm^{-3}$ and the concentration of Zn is saturated in the vicinity of $2 \times 10^{18}$ $cm^{-3}$–$3 \times 10^{18}$ $cm^{-3}$ or more. Further, when DEZn is supplied excessively (500 cc) near the saturation density, the Zn diffusion distance increases abruptly. This is because inactive Zn entering between lattices increases as it approaches the saturation concentration and Zn between the lattices diffuses easily and further because excess Zn at or higher than the saturation density is easily extended into the undoped layer.

Figure 3:
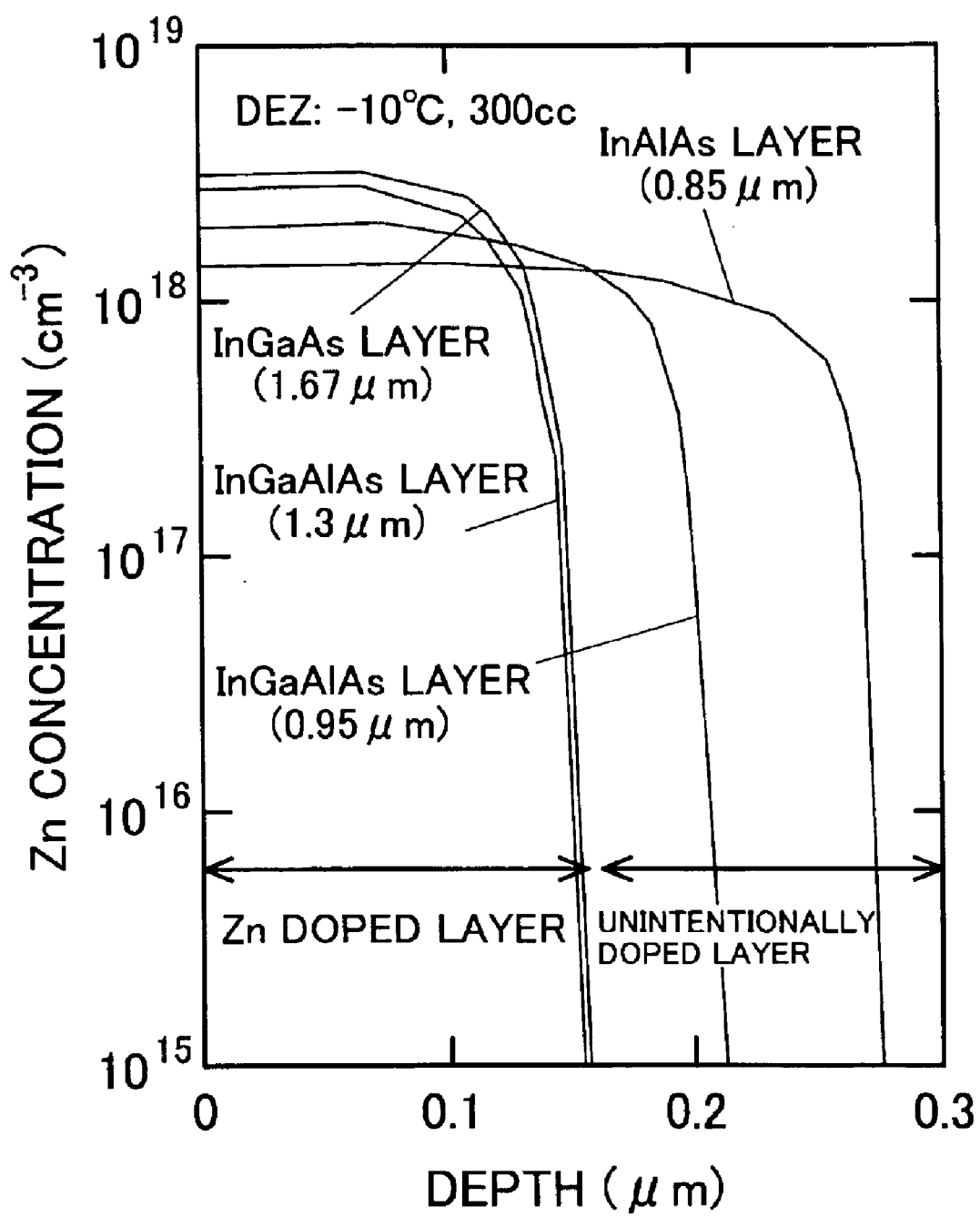
FIG. 3 is a graph showing another example of Zn profiles in both undoped and Zn-doped InGaAlAs layers.

FIG. 3 shows Zn profiles when undoped InGaAlAs layers and Zn-doped InGaAlAs layers of various composition wavelength are grown on InP substrates. They are the Zn profiles when the DEZn (at −10° C.) as the Zn starting material is set to 300 cc and the composition of the InGaAlAs layer is varied. The Zn concentration in the InGaAs layer and the InGaAlAs layer at 1.3 μm wavelength is near $4 \times 10^{18}$ $cm^{-3}$ in which the Zn concentration increases compared with InGaAlAs layer at 950 nm and the InAlAs layer to provide a steep Zn profile. On the other hand, in InAlAs, the Zn concentration at a flat area decreases and the Zn diffusion distance also increases. This is because the Zn saturation concentration and the critical concentration for Zn diffusion is lower than $4 \times 10^{18}$ $cm^{-3}$ in the InAlAs layer, and excess Zn diffuses to the undoped layer.

FIG. 1 is a diagram for arranging the Zn saturation concentration and Zn critical concentration at which Zn diffuses in each of InGaAlAs compositions on the basis of the foregoing results. For each of the compositions of the InGaAlAs layers, a composition lattice matching with the InP substrate can be attained by varying the ratio between Ga and Al while setting the In composition at about 0.52–0.53. FIG. 1 arranges the saturation concentration of Zn and the critical concentration for Zn diffusion to the Al composition. In each of the InGaAlAs compositions (compositions varying from InAlAs to InGaAs), the critical concentration for Zn diffusion is about one-half of the Zn saturation concentration. The critical concentration of the InAlAs (Al composition: 0.48) layer is about $1 \times 10^{18}$ $cm^{-3}$, and the critical concentration for Zn diffusion of the InGaAs (Ga composition: 0.47) is about $1 \times 10^{19}$ $cm^{-3}$, and the critical concentration increases along with a decrease of the Al composition. When the relation is approximated to a simple exponential function, it is about $1.2 \times 10^{19}$ exp (−5× (Al compositional ratio)). Further, the critical concentration for Zn diffusion in the InP layer (wavelength: 920 nm) is about $5 \times 10^{17}$ $cm^{-3}$ and, when the InGaAsP layer is compared with the InGaAlAs layer at an identical band gap wavelength, the critical concentration for Zn diffusion tends to be lower in the InGaAsP system. That is, the critical concentration, for example, in the InGaAlAs layer at 920 nm is about $1.3 \times 10^{18}$ $cm^{-3}$.

Figure 4:
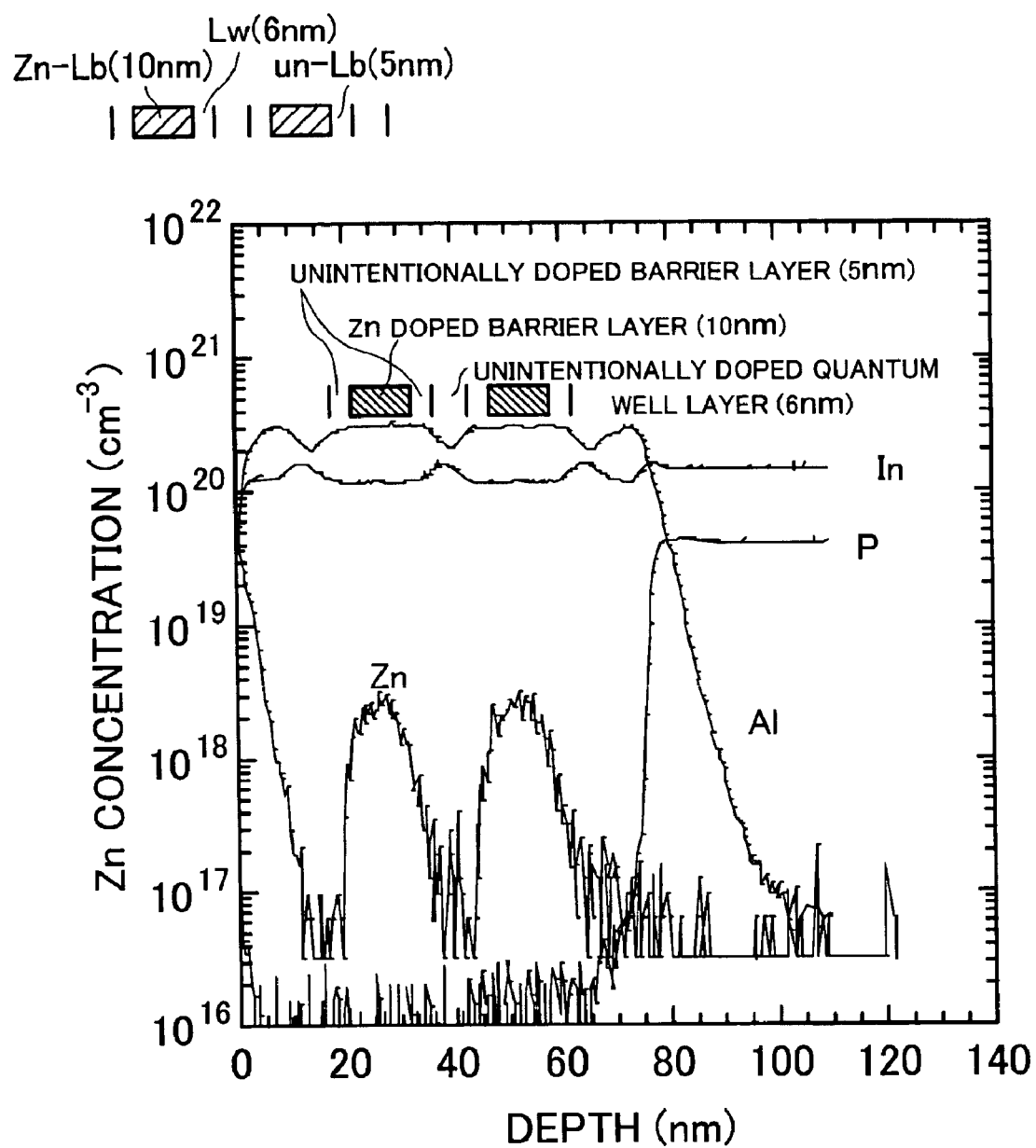
FIG. 4 is a graph showing an example of Zn profiles in a modulation-doped structure of InGaAlAs.
Figure 5:
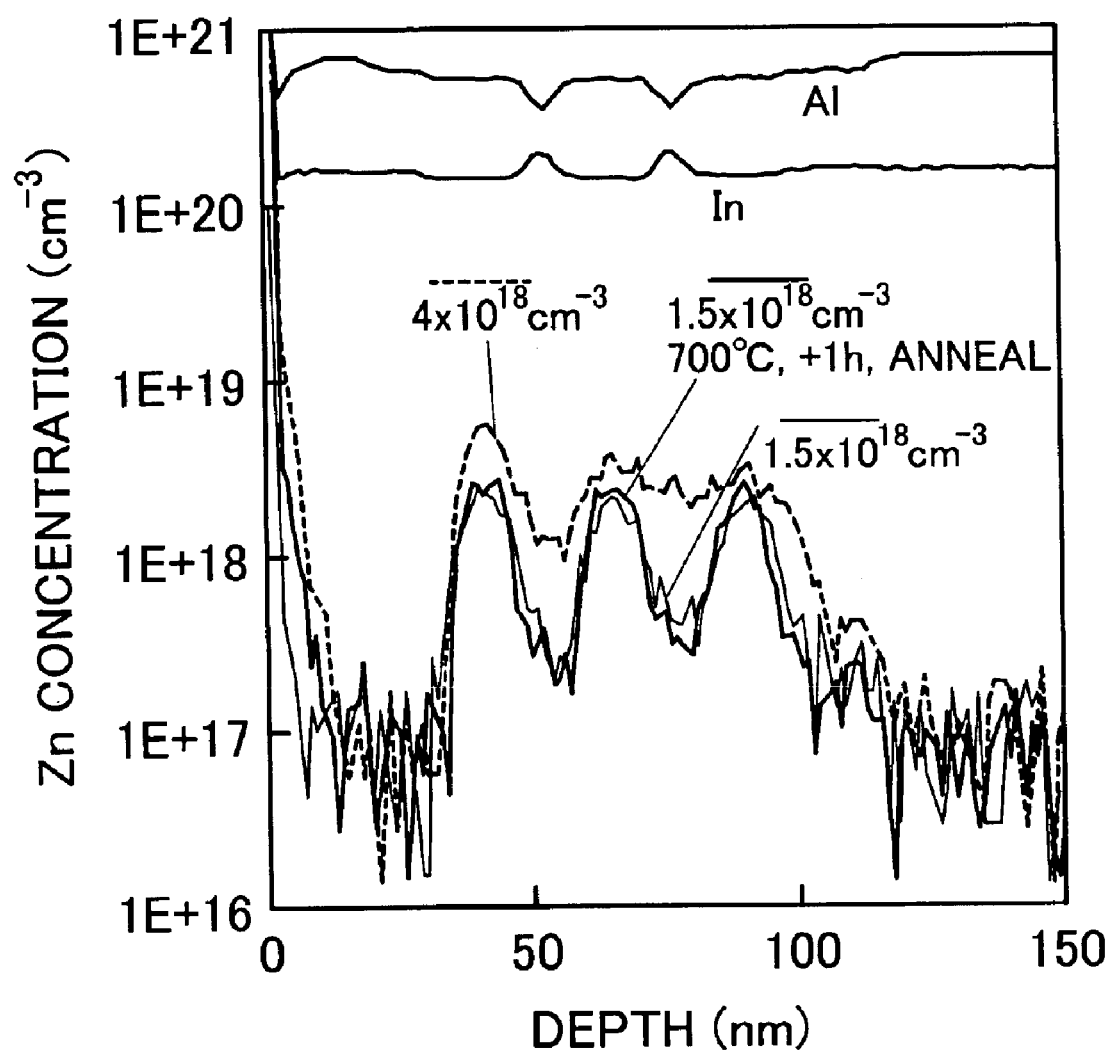
FIG. 5 is a graph showing another example of Zn profiles in a modulation-doped structure of InGaAlAs.

FIGS. 4 and 5 show Zn profiles in the multiple quantum well structure when the modulation doped structure for the actually manufactured InGaAlAs layers (wavelength: 1100 nm, Al composition: 0.35) is analyzed by SIMS (Secondary Ion Mass Spectroscopy). FIG. 4 shows the distributions of In, Al, P and Zn in the direction of depth. Each of the layers in the multiple quantum well structure is shown corresponding to the distribution of each element in the upper part of the figure. Referring to FIG. 4, it can be seen that a satisfactory modulation doped multiple quantum well structure can be attained by using the Zn dopant. That is, as shown in FIG. 4, the Zn concentration decreases steeply at 10 nm or less also for high concentration Zn at $2 \times 10^{18}$ $cm^{-3}$–$3 \times 10^{18}$ $cm^{-3}$, and it can be said that Zn diffusion into the well layer is not observed.

Further, FIG. 5 shows a result of the experiment for the effect of plural Zn concentrations and annealing. FIG. 5 also shows the distribution of In, Al and Zn in the direction of depth. The Zn concentration includes two levels, that is, $4 \times 10^{18}$ $cm^{-3}$ and $1.5 \times 10^{18}$ $cm^{-3}$ For the example of $1.5 \times 10^{18}$ $cm^{-3}$, high temperature annealing is applied at 700° C. for 1 hr. As can be seen from FIG. 5, Zn profile is not changed before and after the high temperature annealing at 700° C. for 1 hr. However, it shows that Zn diffuses easily when the Zn concentration exceeds the critical concentration of Zn diffusion as $4 \times 10^{18}$ $cm^{-3}$. In the practice of this invention, Zn concentration should be kept so as not to exceed the critical concentration of Zn diffusion to the matrix.

Based on the facts described above, in the multiple quantum well structure applied with Zn modulation doping or optical guiding layer applied with Zn doping, an improvement in the device characteristic and degradation of characteristic caused by Zn diffusion can be balanced by optimizing the relation between the crystal composition of the Zn-doped InGaAlAs layer and the Zn concentration below the critical concentration.

Essential factors of the invention described above specifically are as follows. When the semiconductor laser device is constituted, usual means for the semiconductor laser devices may be adopted for the constitutions other than the active layer region having the quantum structure of the invention. Also for the light feedback means in the laser device, various kinds of Fabri Perro, DFB (Distributed Feedback) or DBR (Distributed Bragg Diffraction) can be used as required. Further, also for lateral light confinement, various types of means such as ridge type or buried hetero type may also be adopted as required.

The optical semiconductor device according to this invention has a basic constitution comprising an active layer region of a quantum well structure having a first semiconductor layer and a second semiconductor layer of a larger forbidden band gap than that of the first semiconductor layer above a semiconductor substrate, in which the second semiconductor layer of the quantum well structure comprises a quaternary alloy of InGaAlAs and the quantum well structure is applied with modulation doping in which the second semiconductor layer contains Zn.

For the quantum well structure, a multiple quantum well structure in which the first semiconductor layer and the second semiconductor layer having a larger forbidden band gap than that of the first semiconductor layer are stacked alternately can be used as required. InP is most useful material for the semiconductor substrate. Further, for the first semiconductor layer, that is, the so-called well layer, undoped InGaAlAs is frequently used.

Further, it is to be noted that the concentration of Zn contained in the second semiconductor layer, the so-called barrier layer is less than the critical concentration relative to the diffusion of Zn in the second semiconductor layer.

The concentration of Zn contained in $In_xGa_{1-x-y}Al_yAs$ (where $0<x<1$, $0<y<1$, $x+y \neq 1$) as the second semiconductor layer can be less than the value represented by $1.2 \times 10^{19} \exp(-5xy)$ relative to the compositional ratio y of Al.

Referring to an example of a more practical range for the Zn concentration, the Al composition in the second semiconductor layer is within a range from 0.04 to 0.44, and the concentration of Zn thereof is lower than the concentration of Zn on a line connecting the points of the concentration of Zn at $9.8 \times 10^{18}$ cm$^{-3}$ for the Al compositional ratio of 0.04 and the Zn concentration of Zn of $1.3 \times 10^{18}$ cm$^{-3}$ for the Al compositional ratio of 0.44 in a diagram for the relation of the Al compositional ratio and the concentration of Zn in the exponential expression to the Al composition of the second semiconductor layer.

The Zn concentration is preferably $1.0 \times 10^{18}$ cm$^{-3}$ or more. This is for obtaining a substantially satisfactory modulation doped. The relaxation oscillation frequency of the laser can be increased by the modulation-doped structure. The relaxation oscillation frequency increases along with an increase in the modulation-doped Zn concentration and the Zn concentration is preferably $1.0 \times 10^{18}$ cm$^{-3}$ or more in order to increase the relaxation oscillation frequency as described above.

In FIG. 1 showing a relation between the Al compositional ratio and the Zn concentration given by exponential expression, a more preferred Zn concentration relative to the Al compositional ratio of the second semiconductor layer is within a range I surrounded with four points, that is, point A (in FIG. 1) at the Zn concentration of $9.8 \times 10^{18}$ cm$^{-3}$ for the Al compositional ratio of 0.04, point B (in FIG. 1) at the Zn concentration of $1.0 \times 10^{18}$ cm$^{-3}$ for the Al compositional ratio of 0.04, point C (in FIG. 1) at the Zn concentration of $1.0 \times 10^{18}$ cm$^{-3}$ for the Al compositional ratio of 0.44, and point D (in FIG. 1) at the Zn concentration of $1.3 \times 10^{18}$ cm$^{-3}$ for the Al compositional ratio of 0.44. A quaternary system material is preferred for practicing this invention, and it can be said that the compositional range described above is a preferred range in view of the above.

The technical idea of the invention can be applied not only to the quantum well structure but also to an optical guiding layer or an etching stopper layer of an optical semiconductor device, or to the so-called buried layer for burying the sides of stripe-shaped semiconductor regions. Thus, a purpose of the p-type semiconductor layer can be attained while preventing diffusion of Zn from the semiconductor thin layer.

In this invention, the metal organic vapor phase epitaxy can be used effectively for the formation of the semiconductor layer. That is, a typical embodiment of the production process is a fabrication method including at least a step of forming a first semiconductor layer comprising a quaternary alloy of InGaAlAs constituting a quantum well structure of an active layer region by an metal organic vapor phase epitaxy and a step of forming a second semiconductor layer comprising a quaternary alloy of InGaAlAs of a larger forbidden band gap than that of the first semiconductor layer and containing Zn at a level less the critical concentration of Zn for the material by a metal organic vapor phase epitaxy above the semiconductor substrate.

Further, another embodiment includes steps of at least forming a semiconductor stack having a first semiconductor layer constituting a quantum well structure of an active layer region comprising a quaternary alloy of InGaAlAs and a second semiconductor layer having a larger forbidden band gap than that of the first semiconductor layer, comprising a quaternary alloy of InGaAlAs and containing Zn at a level less than the critical concentration of Zn for the material by metal organic vapor phase epitaxy, fabricating at least a portion of the semiconductor stack into a stripe shape and forming first and second semiconductor regions by metal organic vapor phase epitaxy on both sides in parallel with the longitudinal direction of the stripe shaped semiconductor stack. As described above, the metal organic vapor phase epitaxy is used effectively for the modulation doped multiple quantum well structure, the multi-layered structure and the buried structure.

Consideration and Problems in the Prior Art

In the technique shown by Document 1 of the prior art described above, while Zn diffusion in the barrier layer somewhat decreases but this involves a problem in suppressing Zn diffusion from the portion of the barrier layer in contact with the well layer. Further since the thickness of the barrier layer is as thin as 0.7 nm, the Zn concentration is easily saturated in the InGaAs layer. Accordingly, it has a difficulty that Zn diffuses as far as the well layer.

In the technique of Document 2 described above, Be at high concentration of $1 \times 10^{19}$ cm$^{-3}$ is doped only to the AlGaAs barrier layer of a GaAs/AlGaAs quantum well structure by molecular beam epitaxy to attain a steep doping profile. However, Be cannot be used in the metal organic vapor phase epitaxy. Further, there is a drawback that when Zn is doped at a high concentration to the InGaAsP barrier layer, a Zn-doped layer at high concentration is formed as far as in the well layer.

In the technique of Document 3 described above, Zn diffusion decreases somewhat in the InAlAs layer compared with the InP layer. However, it diffuses by several tens nm or more and it is impossible to attain a steep modulation doped multiple quantum well structure with the InAlAs layer.

In the technique of Document 4 described above, the device resistance is lowest in the structure Zn-doped from the p-InP cladding layer to the p-InGaAsP guiding layer just above the active layer but Zn diffuses as far as the inside of the active layer to deteriorate the laser characteristics such as threshold current or efficiency. Therefore, it is difficult to balance the increase in the Zn concentration and the decrease in the Zn diffusion in the InGaAsP system also in a thick film of several tens nm or more. Any of the measures reported so far has not yet reached a practical level as described above.

EXAMPLE 1

Figure 6:
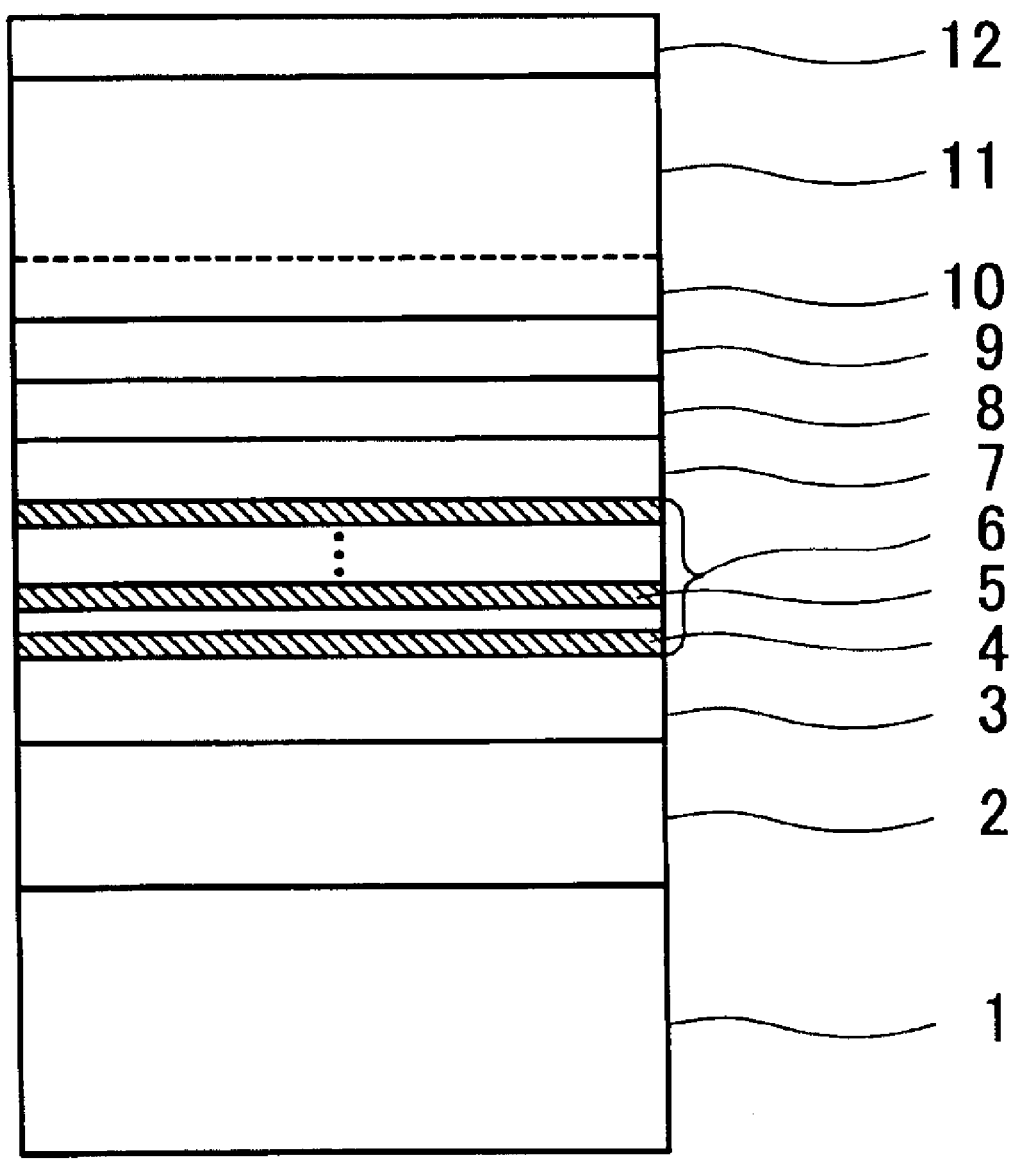
FIG. 6 is a cross sectional view of a semiconductor stack showing a first embodiment according to this invention.

FIG. 6 is a cross sectional view showing an example of applying the invention to a p-type modulation doped multiple quantum well structure. An n-InP buffer layer 2 (Si concentration: $1 \times 10^{18}$ cm$^{-3}$, 500 nm thickness) and an n-InGaAlAs guiding layer 3 (80 nm thickness, lattice matched with InP substrate, composition wavelength; 1000 nm, Si concentration: $1 \times 10^{18}$ cm$^{-3}$) are stacked on an InP substrate 1. Further, a modulation doped strained quantum well structure 6 (5 period), an undoped InGaAlAs guiding layer 7 (80 nm thickness, lattice matched with In substrate, Al composition: 0.39, wavelength: 1000 nm), a p-InAlAs cladding layer 8 (100 nm thickness, lattice matched with InP substrate, Al composition: 0.48, Zn concentration: $2 \times 10^{17}$ cm$^{-3}$), a p-InGaAlAs etching stopper layer 9 (50 nm thickness, lattice matched with InP substrate, Al composition: 0.30, Zn concentration: $2 \times 10^{17}$ cm$^{-3}$), a p-InP cladding layer 10 (200 nm, Zn concentration: $2 \times 10^{17}$ cm$^{-3}$), a p-InP cladding layer 11 (1500 nm thickness, Zn concentration: $8 \times 10^{17}$ cm$^{-3}$) and a p-InGaAs contact layer 12 (200 nm thickness, lattice matched with InP substrate, Zn concentration: $2 \times 10^{19}$ cm$^{-3}$) are grown successively. The modulation doped strained quantum well structure 6 comprises an undoped InGaAlAs strained quantum well layer 4 (strained amount: +1.3%, 6 nm thickness), and a Zn-doped InGaAlAs barrier layer 5 (strained amount: −0.4%, 10 nm thickness, Al composition for the barrier layer: 0.35, Zn concentration: $2 \times 10^{18}$ cm$^{-3}$, undoped for 1 nm on both ends). The period of the barrier layer and the well layer was five. In the invention, the constitution of the multiple quantum well structure is important.

Figure 7:
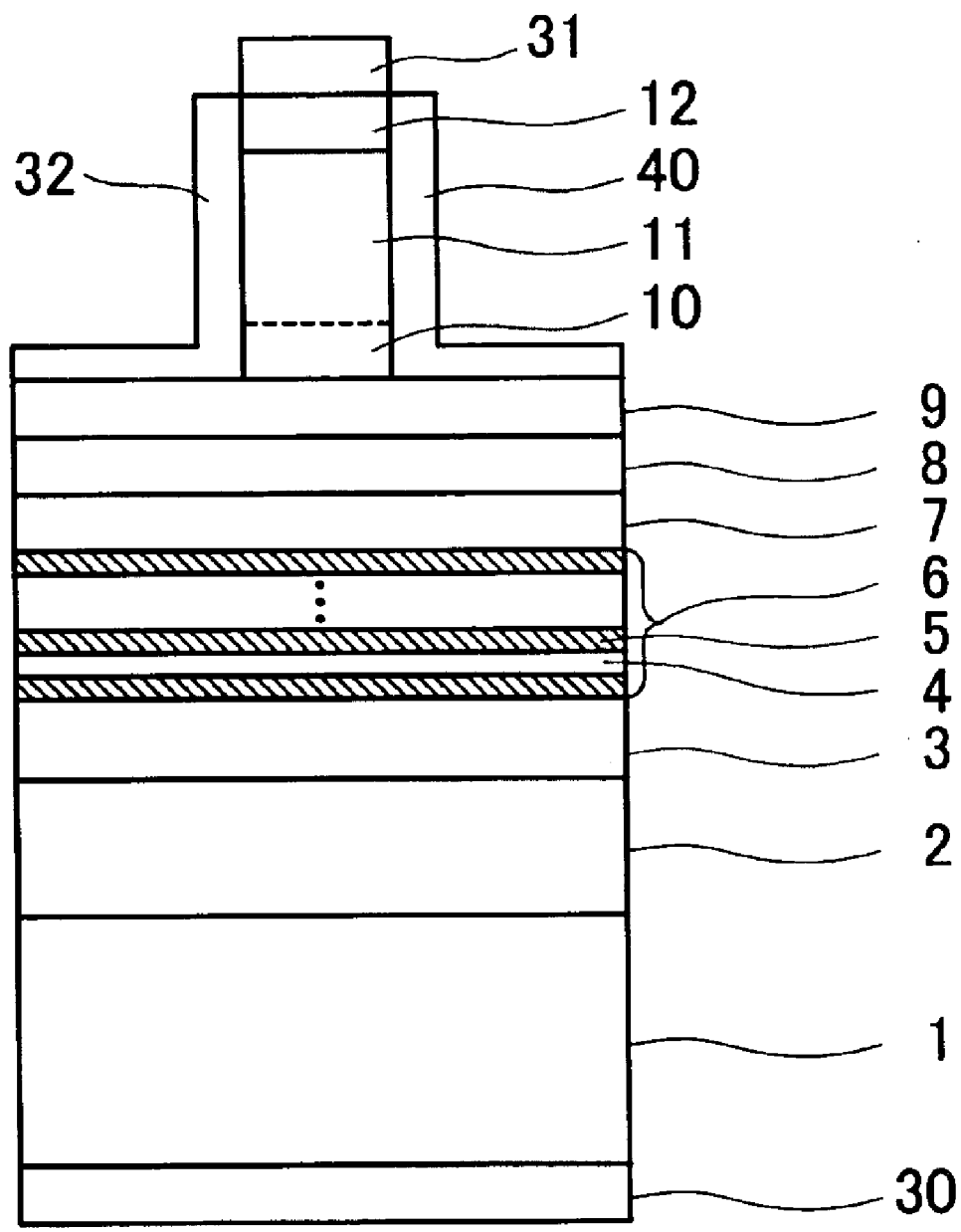
FIG. 7 is a cross sectional view taking along a plane crossing a light propagating direction of a device showing a first embodiment according to this invention.

Subsequently, the thus prepared semiconductor stack is formed by usual etching into a ridge-like mesa shape 40 to obtain a laser structure. FIG. 7 is a cross sectional view of this device. In FIG. 7, portions identical to those in FIG. 6 carry the same reference numerals. FIG. 7 is a cross sectional view taking along a plane crossing the propagating direction of a laser light. References 30 and 31 represent n-side electrode and p-side electrode, respectively, and reference 32 represents a passivation film.

In this example, Zn is doped at a Zn concentration of $2 \times 10^{18}$ cm$^{-3}$ to the InGaAlAs barrier layer (band gap wavelength: 1000 nm) and the relaxation oscillation frequency can be increased by about 30% compared with the undoped barrier layer. Further, when Zn at a flow rate corresponding to $5 \times 10^{18}$ cm$^{-3}$ is doped, since Zn diffuses also to the well layer, the threshold current is increased by 40% compared with the undoped barrier layer. However, an increase in the current value within the range of the invention is about 10% compared with the undoped strained multiple quantum well structure.

In the invention, the composition wavelength of the InGaAlAs barrier layer is set to 1000 nm but other compositions may also be used. In InGaAlAs having the composition wavelength of 1000 nm or more, the Zn concentration could be increased further. For example, in the InGaAlAs barrier layer at a composition wavelength of 1200 nm (Al composition: 0.21), the Zn concentration could be increased to $4 \times 10^{18}$ cm$^{-3}$ and the relaxation oscillation frequency could be increased by about 50% compared with the undoped barrier layer. On the other hand, the lower limit for the Zn concentration in the InGaAlAs layer was desirably at a concentration of about $1 \times 10^{18}$ cm$^{-3}$ in order to obtain the effect of modulation doping while this depends on the MQW structure.

While the strained amount of the barrier layer was set to −0.4% in this example, other strained amount may also be used so long as it is within the critical thickness to the strained amount. This is applicable also for the strained amount of the well layer in which other strained amount may also be used so long as it is within the critical thickness to the strained amount. Also for the polarity of the strain, while it is defined as positive (compressive) in the well layer and as negative (tensile) in the barrier layer in this example, they may be combined in an opposite manner. In the doping to the barrier layer both ends are undoped each by 1 nm in this example. Alternatively, undoped layer may be formed at both ends each of several nm or less, or the entire barrier layer may be doped uniformly for the modulation-doped structure. Further, the thickness of the barrier layer is set to 10 nm in this example but larger thickness may be adopted to increase the p-type hole concentration generated from the barrier layer.

EXAMPLE 2

Figure 8:
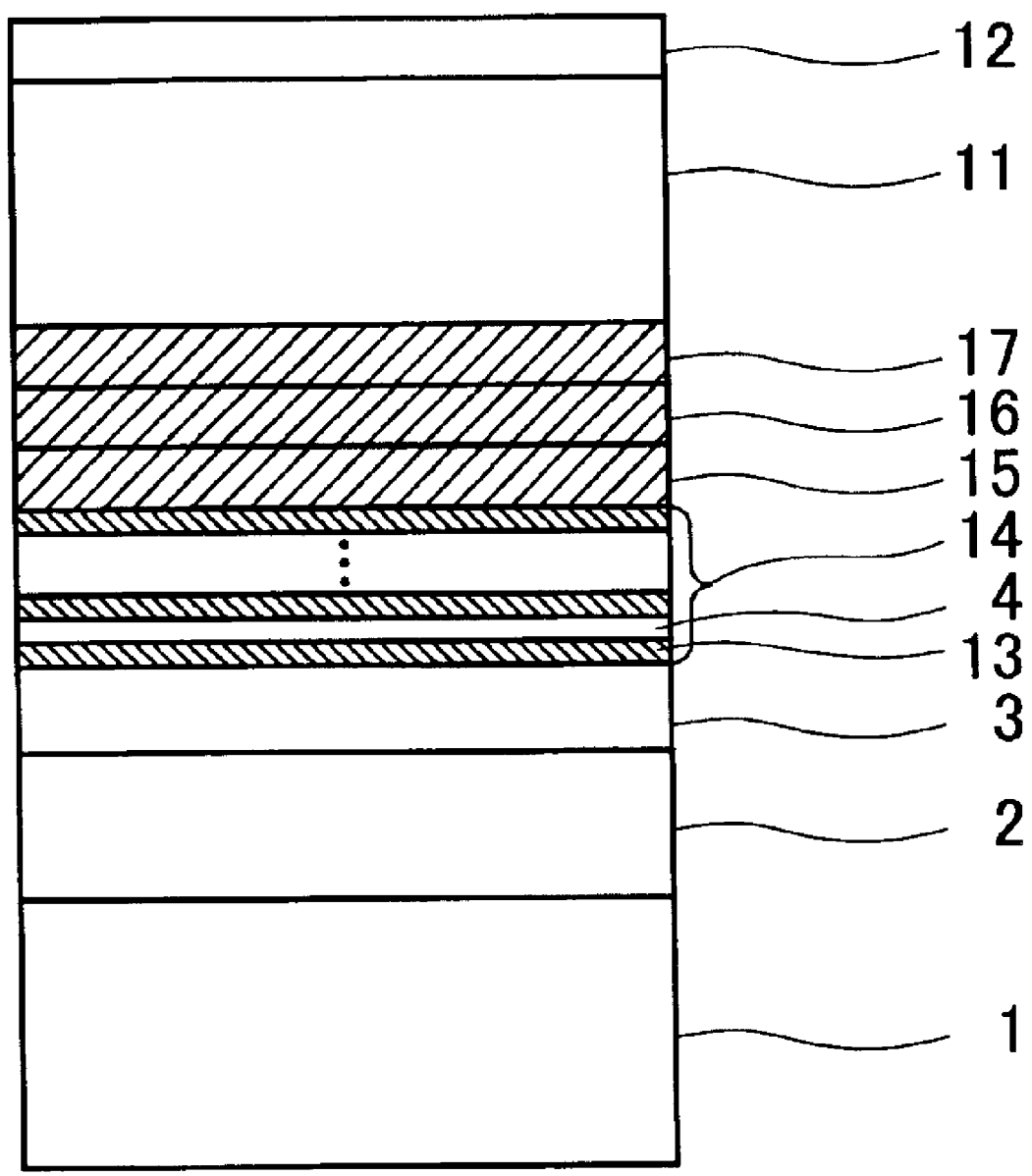
FIG. 8 is a cross sectional view of a semiconductor stack showing a second embodiment according to this invention.

FIG. 8 is a cross sectional view showing an example of applying the invention to a p-guiding layer and a p-cladding layer.

On an n-InP substrate 1, an n-InP buffer layer 2 (Si concentration: $1 \times 10^{18}$ cm$^{-3}$, 500 nm thickness), an n-InGaAlAs guiding layer 3 (80 nm thickness, lattice matched with InP substrate, wavelength: 1000 nm, Si concentration; $1 \times 10^{18}$ cm$^{-3}$), a strained multiple quantum well structure 14 (5 period), a p-InGaAlAs guiding layer 15 (80 nm thickness, lattice matched with InP substrate, Al composition: 0.39, wavelength: 1000 nm, Zn concentration: $1 \times 10^{18}$ cm$^{-3}$), a p-InAlAs cladding layer 16 (100 nm thickness, lattice matched with InP substrate, al composition: 0.48, Zn concentration: $1 \times 10^{18}$ cm$^{-3}$), a p-InGaAlAs etching stopper layer 17 (50 nm thickness, lattice matched with InP substrate, Al composition: 0.30, Zn concentration: $1 \times 10^{18}$ cm$^{-3}$), a p-InP cladding layer 11 (1700 nm, Zn concentration; $8 \times 10^{17}$ cm$^{-3}$) and a p-InGaAs contact layer 12 (Zn concentration: $2 \times 10^{19}$ cm$^{-3}$) are grown successively on an n-InP substrate 1. The strained multiple quantum well structure 14 comprised an undoped InGaAlAs well layer 4 (strained amount: +1.3%, 6 nm thickness) and an undoped InGaAlAs barrier 13 (strained amount: −0.4%, 10 nm thickness, Al composition for the barrier layer: 0.35). Further, the period for the barrier layer and the well layer is five.

Then, the thus prepared semiconductor stack is formed by etching into a ridge-like mesa shape to form a laser structure. Since the cross sectional shape of the semiconductor laser device having the mesa shape is basically identical with the foregoing example it is not shown in the drawing is omitted.

Figure 9:
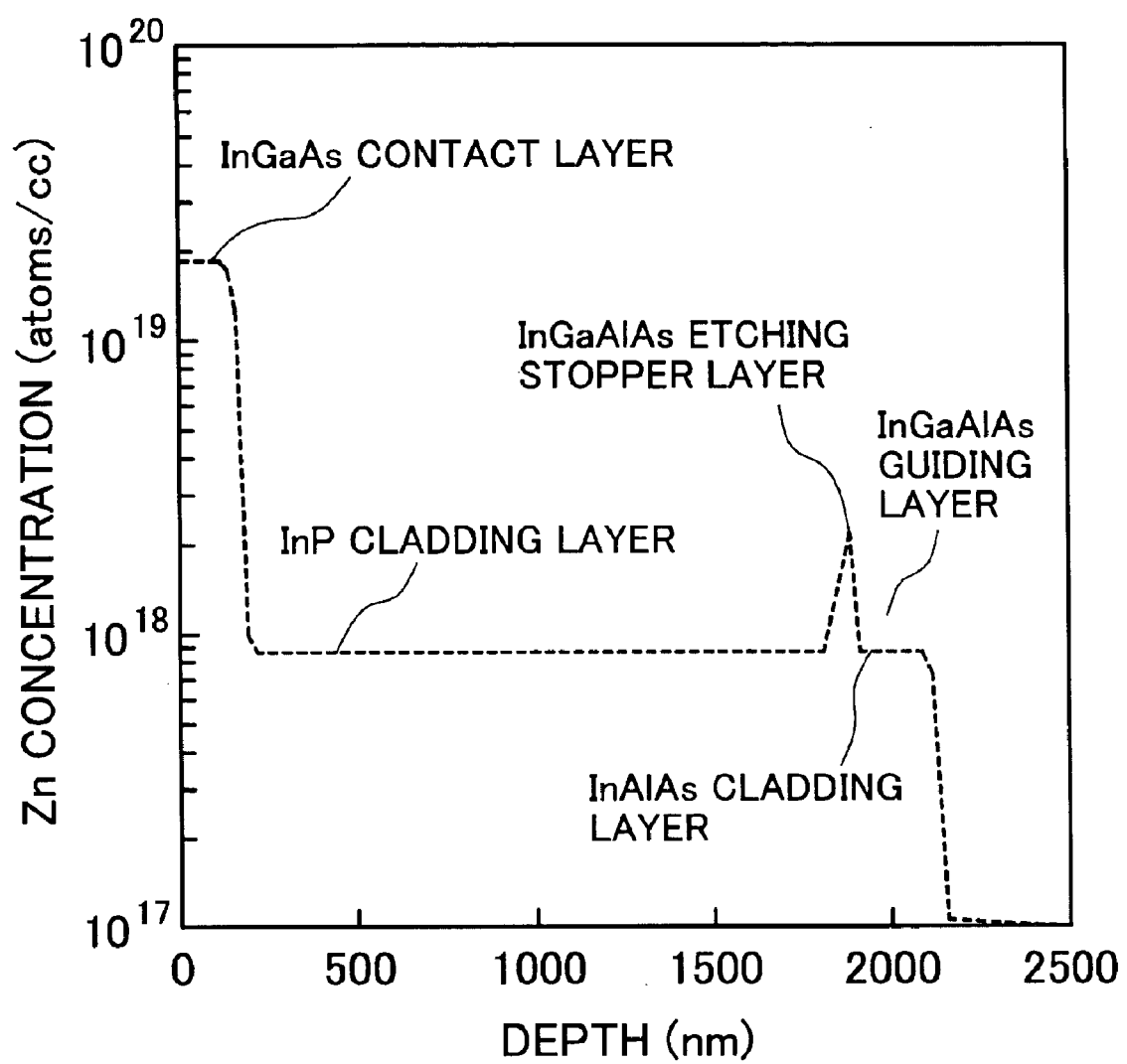
FIG. 9 is a graph for SIMS analysis showing the distribution of a concentration of Zn in the stacking direction in a semiconductor stack of a second embodiment.

FIG. 9 shows a Zn profile relative to the depth in the stacking direction of the semiconductor stack. Correspondence to each of the layers is shown in the Zn profile in the figure. Since the Zn concentration in the P-InP cladding layer exceeds the critical concentration of the Zn diffusion, Zn diffuses to the p-InGaAlAs etching stopper layer. However, since the Zn saturation concentration in the etching stopper layer is high, Zn concentration only increases slightly in the etching stopper layer and diffusion as far as the InAlAs cladding layer or the active layer does not occur. Further, the Zn concentration of the p-InAlAs cladding layer or the p-InGaAlAs guiding layer is as somewhat high as $1\times10^{18}$ cm$^{-3}$. However, since the critical concentration of Zn diffusion is high in the p-InGaAlAs layer, Zn does not diffuse as far as the undoped multiple quantum well active layer. With the foregoing, there is no requirement for disposing the p-InP cladding layer or the undoped guiding layer at low concentration just above the active layer in the Zn-doped InGaAlAs system and the Zn concentration just above the active layer can be increased.

Further, in this invention, the resistance can be decreased by about 1.5 Ω compared, for example, in the undoped InGaAlAs guiding layer and the p-InAlAs cladding layer 10 (Zn concentration; $2\times10^{17}$ cm$^{-3}$) at low doped concentration and the operation voltage at an output of 8 mW can also be decreased by about 0.2 V also for the operation voltage.

The threshold current value at room temperature is 10 to 15 mA in each of the existent low concentration InGaAlAs system structure, low concentration InGaAsP system structure and this invention; the threshold current value does not increase.

On the other hand, when the Zn concentration is intended to increase in a p-InGaAsP guiding layer (80 nm thickness, lattice matched with InP substrate, wavelength: 1000 nm, Zn concentration: $1.5\times10^{18}$ cm$^{-3}$) and a p-InP cladding layer (1700 nm thickness, lattice matched with InP substrate, Zn concentration: $8\times10^{17}$ cm$^{-3}$) in the InGaAsP system alloy, excess Zn diffuses into the undoped active layer and the threshold current value increases greatly as 20 to 25 mA.

In this invention, the Zn concentration of the guiding layer and the cladding layer just above the active layer is set to $1\times10^{18}$ cm$^{-3}$ but the concentration can be increased further within the range shown in FIG. 1 when the wavelength of the InGaAlAs layer is increased. Further, the lower limit for the Zn concentration in the InGaAlAs layer is desirably about from $1\times10^{18}$ cm$^{-3}$ to $4\times10^{18}$ cm$^{-3}$, although it depends on the mesa width, in view of the device resistance and the loss since doping at excessively high concentration leads to loss in the laser oscillation. Further, in the invention, while the undoped strained multiple quantum well structure is used, a modulation-doped multiple quantum well structure may also be adopted.

EXAMPLE 3

Figure 10:
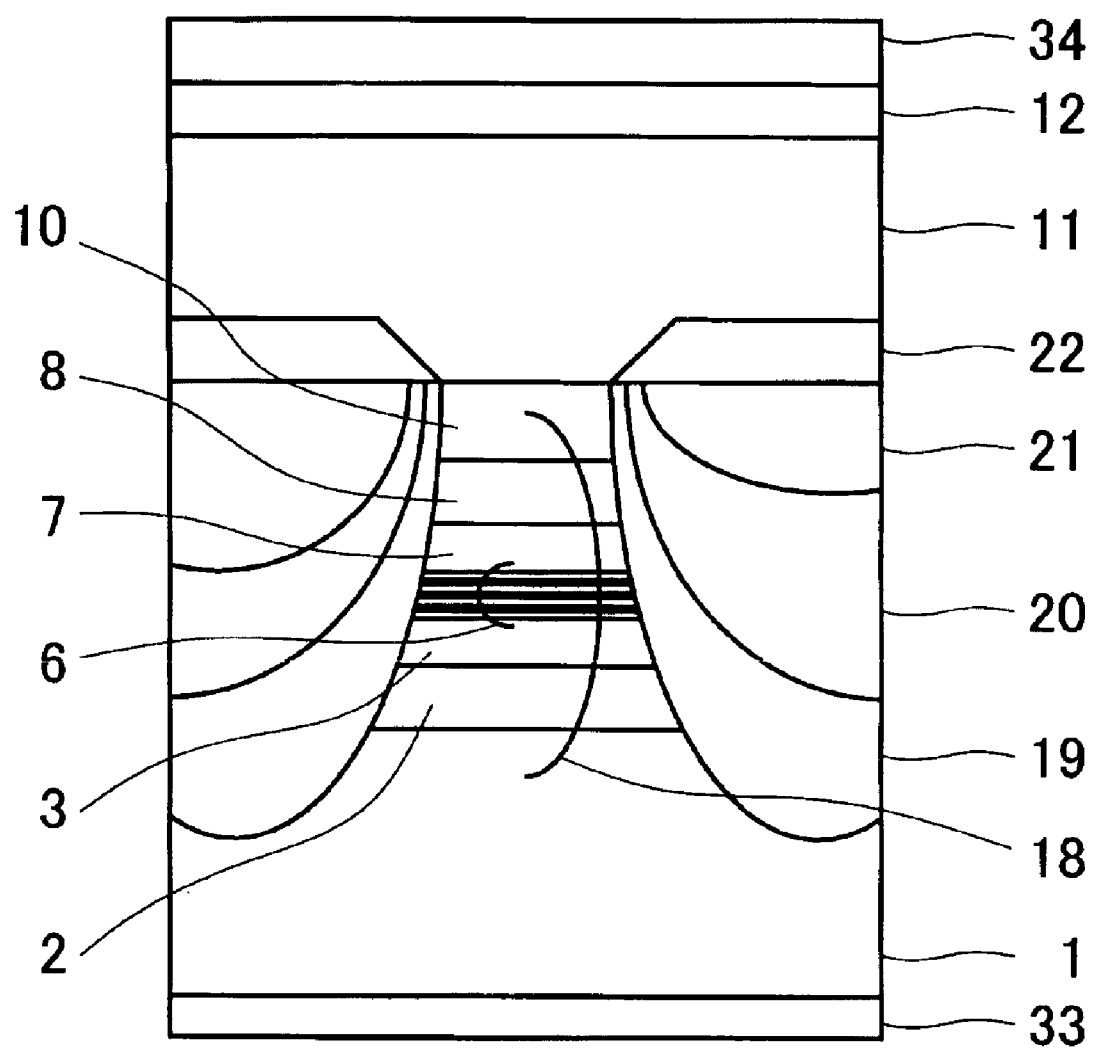
FIG. 10 is a cross sectional view taking along a plane crossing the light propagating direction of a device of a third embodiment according to this invention

FIG. 10 is an example of applying the invention to an InGaAlAs system buried type laser. FIG. 10 is a cross sectional view taking along a plane crossing the propagating direction of the laser light.

In the same manner as in the example described above, each of the layers as far as the active layer is stacked on an n-InP substrate 1. Further, an undoped InGaAlAs guiding layer 7 (80 nm thickness, lattice matched with InP substrate, Al composition: 0.39, wavelength: 1,000 nm), a p-InAlAs cladding layer 8 (50 nm thickness, lattice matched with InP substrate, Al composition: 0.48, Zn concentration: $2\times10^{17}$ cm$^{-3}$) and a p-InP cladding layer 10 (200 nm, Zn concentration: $2\times10^{17}$ cm$^{-3}$) are stacked. Subsequently, the semiconductor stack is etched from the surface layer to the substrate by dry etching or wet etching using an oxide film as a mask to form a mesa shape 18. Then, both sides of the mesa shape are buried with a p-InGaAlAs layer 19 (500 nm thickness, lattice matched with InP substrate, wavelength: 1050 nm, Al composition: 0.35, Zn concentration: $2\times10^{18}$ cm$^{-3}$), an n-InAlAs layer 20 (800 nm thickness, lattice matched with InP substrate, Al composition: 0.48, n-type concentration: $1\times10^{18}$ cm$^{-3}$), a p-InGaAlAs layer 21 (800 nm thickness, lattice matched with InP substrate, wavelength: 1050 nm, Al composition: 0.35, Zn concentration: $2\times10^{18}$ cm$^{-3}$) and a p-InP layer 22 (400 nm thickness, Zn concentration: $8\times10^{17}$ cm$^{-3}$). After removing the oxide film, a p-InP cladding layer 11 (1700 nm, Zn concentration: $8\times10^{17}$ cm$^{-3}$), and a p-InGaAs contact layer 12 (Zn concentration: $2\times10^{19}$ cm$^{-3}$) are stacked in the same manner as that for ordinary multi-layered structures to obtain a buried laser structure. References 33 and 34 represent n-side electrode and p-side electrode, respectively.

In a case where the mesa sides are buried only with p-InP and n-InP in the prior art, Zn diffusion to the undoped active layer is suppressed by lowering the Zn concentration to about $4\times10^{17}$ cm$^{-3}$. However, in a case of burying with the InGaAlAs layer according to the invention, since the critical concentration for Zn diffusion is high, Zn concentration can be increased. As a result, a large current blocking effect by p-n junction can be obtained. For example, the maximum optical power at 85° C. can be increased by about 40% compared with Zn concentration: $4\times10^{17}$ cm$^{-3}$. On the other hand, when the mesa sides are buried with a p-InP layer at $2\times10^{18}$ cm$^{-3}$, since Zn diffuses to the n-InP layer or the undoped active layer, the threshold current value is increased by about 50%. On the other hand, in this invention, the threshold current value is about identical with that of the p-InP layer at a low concentration ($4\times10^{17}$ cm$^{-3}$).

In this invention, InGaAlAs at a composition wavelength: 1050 nm is used for the mesa sides, but InGaAlAs of other compositions wavelength may also be used and, when the composition wavelength of InGaAlAs is made longer, concentration can be further increased within the range of the upper limit in FIG. 1 (for example, $1.2\times10^{19}$ exp (−5×(Al composition ratio))). Further, the lower limit for the Zn concentration in the p-InGaAlAs layer on the mesa side is desirably $1\times10^{18}$ cm$^{-3}$ or more, although depending on the buried structure, since no large current blocking effect can be obtained at a low concentration.

In the invention, the surface of the buried layer is terminated at p-InP layer and this is for preventing the oxidation of the re-growing boundary with the p-InP cladding and, while Zn diffuses from the p-InP buried layer to p-InGaAlAs, since the Zn critical concentration is high in the p-InGaAlAs, Zn does not diffuse to the active layer.

As has been described above specifically, the relaxation oscillation frequency can be increased and the device resistance can be reduced by providing the steep Zn modulation-doped multiple quantum well structure and the increase in the Zn concentration just above the active layer, while suppressing the Zn diffusion in the InGaAlAs system modulation doped multiple quantum well structure and in the Zn concentration just above the active layer with Zn.

This invention can provide an optical semiconductor device having an active layer region of a favorable quantum well structure. In particular, this invention can provide an optical semiconductor device having an active layer region of a multiple quantum well structure with preferred p-type modulation doping.

What is claimed is:

1. An optical semiconductor device having an active layer region of a quantum well structure comprising:
   a semiconductor substrate; and
   a first semiconductor layer, and a second semiconductor layer of a larger forbidden band gap than that of the first semiconductor layer, above the semiconductor substrate, the first and second semiconductor layers forming the quantum well structure,
   wherein the second semiconductor layer of the quantum well structure comprises a quaternary alloy of InGaAlAs and the second semiconductor layer is applied with modulation doping using Zn, and
   wherein the concentration of Zn is within a range surrounded by four points, a point at the concentration of Zn of $9.8 \times 10^{18}$ cm$^{-3}$ for the Al compositional ratio of 0.04, a point at the concentration of Zn of $1.0 \times 10^{18}$ cm$^{-3}$ for the Al compositional ratio of 0.04, a point at the concentration of Zn of $1.0 \times 10^{18}$ cm$^{-3}$ for the Al compositional ratio of 0.44, and a point at the concentration of Zn of $1.3 \times 10^{18}$ cm$^{-3}$ for the Al compositional ratio of 0.44 in a diagram for the relation of the Al compositional ratio and the concentration of Zn in the exponential expression to the Al composition of the second semiconductor layer.

2. An optical semiconductor device as defined in claim 1, wherein the quantum well structure is a multiple quantum well structure having the first semiconductor layer and the second semiconductor layer of a larger forbidden band gap than that of the first semiconductor layer which are stacked alternately.

3. An optical semiconductor device as defined in claim 1, wherein the semiconductor substrate comprises InP.

4. An optical semiconductor device as defined in claim 1, wherein the first semiconductor layer comprises an undoped material.

5. An optical semiconductor device as defined in claim 4, wherein the undoped material is InGaAlAs.

6. An optical semiconductor device as defined in claim 1, wherein the first semiconductor layer in the quantum well structure has at least one member selected from the group consisting of the quaternary alloy of InGaAlAs and InGaAsP, and the ternary alloy of InGaAs.

7. An optical semiconductor device as defined in claim 1, wherein the first semiconductor layer includes a quaternary alloy of InGaAlAs formed by metal organic vapor phase epitaxy, and the second semiconductor layer includes a quaternary alloy of InGaAlAs, containing Zn, formed by metal organic vapor phase epitaxy.

8. An optical semiconductor substrate device comprising:
   a semiconductor substrate;
   a stack of compound semiconductor thin films formed over said semiconductor substrate; and
   at least a thin film comprising p-type InGaAlAs as an optical guiding layer or an etching stopper layer formed over said semiconductor substrate as a top layer of semiconductor layers formed on said semiconductor substrate,
   wherein:
   Zn is included in the thin film comprising p-type InGaAlAs, and
   the concentration of Zn in said thin film comprising p-type InGaAlAs does not exceed the critical concentration for the diffusion of Zn.

9. An optical semiconductor device as defined in claim 8, wherein the stack of the compound semiconductor thin films has an active layer region of a quantum well structure.

10. An optical semiconductor device as defined in claim 8, wherein the stack of the compound semiconductor thin films is formed above a desired semiconductor substrate, in the direction of stacking the compound semiconductor thin films along the main surface of the semiconductor substrate, the stack of the compound semiconductor thin films has, therein, a stripe-like semiconductor region and/or first and second semiconductor regions on both sides parallel with the longitudinal direction of the stripe-like semiconductor stack region, in which the stripe-like semiconductor stack region has at least an active layer region, the first and the second semiconductor regions have at least an InGaAlAs layer containing Zn, and the concentration of Zn in the InGaAlAs layer does not exceed the critical concentration for the diffusion of Zn to the material.

11. An optical semiconductor device as defined in claim 8, wherein the concentration of Zn is within a range surrounded by four points, a point at the concentration of Zn of $9.8 \times 10^{18}$ cm$^{-3}$ for the Al compositional ratio of 0.04, a point at the concentration of Zn of $1.0 \times 10^{18}$ cm$^{-3}$ for the Al compositional ratio of 0.04, a point at the concentration of Zn of $1.0 \times 10^{18}$ cm$^{-3}$ for the Al compositional ratio of 0.44, and a point at the concentration of Zn of $1.3 \times 10^{18}$ cm$^{-3}$ for the Al compositional ratio of 0.44 in a diagram for the relation of the Al compositional ratio and the concentration of Zn in the exponential expression to the Al composition of the second semiconductor layer.

12. An optical semiconductor device as defined in claim 8, wherein the semiconductor substrate comprises InP.

13. An optical semiconductor device as defined in claim 8, wherein the concentration of Zn is at least $1 \times 10^{18}$ cm$^{-3}$ and does not exceed the critical concentration for the diffusion of Zn.

14. An optical semiconductor device comprising:
   a semiconductor substrate;
   a stack of compound semiconductor thin films formed over said semiconductor substrate, the stack of compound semiconductor thin films forming a plurality of stripe-shaped semiconductor regions; and
   a layer of p-type InGaAlAs burying said stripe-shaped semiconductor regions,
   wherein:
   Zn is included in said layer of p-type InGaAlAs burying said stripe-shaped semiconductor regions, and
   the concentration of Zn in said layer of p-type InGaAlAs burying said stripe-shaped semiconductor regions does not exceed the critical concentration for the diffusion of Zn.

15. An optical semiconductor device as defined in claim 14, wherein the concentration of Zn is within a range surrounded by four points, a point at the concentration of Zn of $9.8 \times 10^{18}$ cm$^{-3}$ for the Al compositional ratio of 0.04, a point at the concentration of Zn of $1.0 \times 10^{18}$ cm$^{-3}$ for the Al compositional ratio of 0.04, a point at the concentration of Zn of $1.0 \times 10^{18}$ cm$^{-3}$ for the Al compositional ratio of 0.44, and a point at the concentration of Zn of $1.3 \times 10^{18}$ cm$^{-3}$ for the Al compositional ratio of 0.44 in a diagram for the relation of the Al compositional ratio and the concentration of Zn in the exponential expression to the Al composition of the second semiconductor layer.

16. An optical semiconductor device as defined in claim 14, wherein the semiconductor substrate comprises InP.

17. An optical semiconductor device including an active region of a quantum well structure, and having:

a semiconductor substrate; and the quantum well structure, which comprises a first semiconductor layer and a second semiconductor layer, the second semiconductor layer having a larger forbidden band gap than that of the first semiconductor layer, on the semiconductor substrate, wherein:

the second semiconductor layer comprises a quaternary alloy of InGaAlAs and has Zn included therein as modulation doping, and the concentration of Zn in the second semiconductor layer does not exceed the critical concentration for the diffusion of Zn.

18. An optical semiconductor device as defined in claim 17, wherein the semiconductor substrate comprises InP.

19. An optical semiconductor device as defined in claim 17, wherein the concentration of Zn is at least $1 \times 10^{18}$ cm$^{-3}$ and does not exceed the critical concentration for the diffusion of Zn.

20. An optical semiconductor device as defined in claim 17, wherein the quantum well structure is a multiple quantum well structure having the first semiconductor layer and the second semiconductor layer of a larger forbidden band gap than that of the first semiconductor layer which are stacked alternately.

21. An optical semiconductor device as defined in claim 17, wherein the first semiconductor layer comprises an undoped material.

22. An optical semiconductor device as defined in claim 21, wherein the undoped material is InGaAlAs.

* * * * *